United States Patent
Lee et al.

(10) Patent No.: US 7,383,095 B2
(45) Date of Patent: Jun. 3, 2008

(54) INTEGRATION SYSTEM AND THE METHOD FOR OPERATING THE SAME

(75) Inventors: Yungyao Lee, Yongkang (TW); Ben Liou, Chung-li (TW)

(73) Assignee: ProMOS Technologies Inc., Hsinchu (TW)

( * ) Notice: Subject to any disclaimer, the term of this patent is extended or adjusted under 35 U.S.C. 154(b) by 510 days.

(21) Appl. No.: 11/123,974

(22) Filed: May 6, 2005

(65) Prior Publication Data

US 2006/0163568 A1    Jul. 27, 2006

(30) Foreign Application Priority Data

Jan. 25, 2005    (TW) .............................. 94102103 A

(51) Int. Cl.
*G06F 19/00* (2006.01)
(52) U.S. Cl. .................................... 700/121
(58) Field of Classification Search ................. 700/121
See application file for complete search history.

(56) References Cited

U.S. PATENT DOCUMENTS

2005/0154484 A1* 7/2005 Lee et al. .................... 700/121

* cited by examiner

Primary Examiner—Evan Pert
(74) Attorney, Agent, or Firm—J.C. Patents

(57) ABSTRACT

An integration system for obtaining a set of overlay offset parameters of a first process layer which is going to be formed in an assigned photolithography tool with an assigned mask and an assigned pre-tool. By using the integration system, the set of overlay offset parameters of the first process layer can be precisely predicted based on summing the historic-recorded set of overlay offset parameters and the bias values including a mask bias value, a photolithography tool bias value and a pit-tool bias value. Therefore, the overlay offset parameters corresponding to the same process layer can be well integrated and managed. Hence, the cost and time due to performing the test run can be saved and the throughput can be increased as well.

21 Claims, 4 Drawing Sheets

INTEGRATION SYSTEM AND THE METHOD FOR OPERATING THE SAME

CROSS-REFERENCE TO RELATED APPLICATION

This application claims the priority benefit of Taiwan application Ser. No. 94102103, filed on Jan. 25, 2005. All disclosure of the Taiwan application is incorporated herein by reference.

BACKGROUND OF THE INVENTION

1. Field of Invention

The present invention relates to an integration system and the method for operating the same. More particularly, the present invention relates to an integration system for integrating and managing a plurality of photolithography tools and the method for operating the same.

2. Description of Related Art

In the manufacture of integrated circuits, photolithography is used to transfer patterns from a photo mask having customized circuit patterns to thin films formed on a wafer. The image transfer process comprises steps of forming a photoresist layer on a non-process layer, illuminating the photoresist layer through a photo mask having the customized circuit patterns, developing the photoresist layer and then etching the non-process layer by using the patterned photoresist layer as a mask. Hence, the image transfer process is accomplished. For a well-manufactured integrated circuit product, the image transfer process mentioned above is performed several times to transfer the circuit patterns to each non-process layer to form the electrical device. Therefore, it is important to align the successive patterned layers to reduce the misalignment errors as the critical dimension of the semiconductor device becomes smaller and smaller.

Typically, before the exposure process is performed to transfer the patterns on the photo mask to the photoresist layer formed on the wafer, an alignment process is performed to align the alignment mark on the photo mask to the alignment mark on the wafer. Meanwhile, a test wafer is used to determine the overlay offset parameters and the exposure dose for a particular photolithography process on a particular photolithography tool. The overlay offset parameters are used to ensure the alignment precision between the successive patterned layers and the exposure dose is used to precisely control the critical dimension of the formed layer. However, the process for measuring the overlay offset parameters and the exposure dose by using a test wafer will increase the manufacturing cost and lower down the throughput. Therefore, a photo feedback system is developed to collect the metrology parameters after the exposure and develop process is performed for obtaining a set of overlay offset parameters and then the obtained overlay offset parameters are stored in the host terminal in a way corresponding to the recipe parameters for forming the process layer on the particular photolithography tool. By using the historical overlay offset parameters, the cost for using the test wafer for measuring the overlay offset parameters and the exposure dose can be saved.

Nevertheless, the typical photo feedback system is a tool-centered system focusing on collecting metrology parameters for the photolithography tools respectively. Even though using the same formation recipe to form the same process layer, the different photolithography tools will lead to different sets of overlay offset parameters for the same process layer. For a semiconductor factory with various and mass production lines, many photolithography tools are in use simultaneously. Hence, if a mask is going to be used in a photolithography tool but there is no record about the mask in the photo feedback system of the tool, it is inevitable to use a test wafer to perform a test run which is also known as send-ahead process to determine the overlay offset parameters and the exposure dose even though the mask is used in the other photolithography tool before. Moreover, since even the same preceding process layers which are from in different photolithography tools (the photolithography tool used to form the preceding process layer is denoted as pre-tool in the following description) lead to different metrology results, it is also foreseeable to use a test wafer to performed a test run in order to determine the overlay offset parameters and the exposure dose when the preceding process layer is formed in a photolithography tool, which the preceding process layers for the historical process are not ordinarily formed in and no record of these overlay offset parameters is found in the photo feedback system of. That is, the overlay offset parameters are not efficiently managed and integrated in the current tool-centered photo feedback system. Furthermore, under the circumstances mentioned above, the time for performing the test run and for obtaining metrology result of the test wafer after the test run seriously affect the manufacturing cost and throughput.

SUMMARY OF THE INVENTION

Accordingly, at least one objective of the present invention is to provide an integration system for integrate the overlay offset parameters for each process layer formed by different photolithography tools with different masks and different pre-tools.

At least a second objective of the present invention is to provide a method for operating an integration system for retrieving a set of overlay offset parameters of a layer going to be formed or for updating the integration system while using the newly released photolithography tools or newly released masks.

To achieve these and other advantages and in accordance with the purpose of the invention, as embodied and broadly described herein, the invention provides an integration system for obtaining a set of overlay offset parameters for a first process layer having a first ID number which is going to be formed on a preceding process layer in a first photolithography tool having a third ID number with a first mask having a second ID number, wherein the preceding process layer is formed in a first pre-tool having a fourth ID number. The integration system comprises means for receiving a set of variables including the first ID number, the second ID number, the third ID number and the fourth ID number and means for storing a process layer overlay offset parameter database in a memory storage media. Notably, the process layer overlay offset parameter database comprises a plurality of process layer data pages and each process layer data page comprises a historic-recorded data group having at least one historic-recorded overlay offset parameter set of a process layer corresponding to the process layer data page. For each historic-recorded overlay offset parameter set, there is relative information corresponding to the historic-recorded overlay offset parameter set and the relative information of each historic-recorded overlay offset parameter set includes a second mask with a fifth ID number, a second photolithography tool with a sixth ID number and a second pre-tool with a seventh ID number. The process layer data page further comprises a mask bias data bank having a plurality of mask bias data, a photolithography tool bias data bank having a plurality of photolithography tool bias data and a pre-tool bias data bank having a plurality of pre-tool bias data. The integration system further comprises means for tracing a process layer data page by referring to the received first ID number and means for calculating a set of the overlay offset parameters of the first process layer by using a historic-recorded overlay offset parameter set selected from the historic-recorded data group of the process layer data page and a set of bias data including the mask bias data corresponding to the second ID number and the fifth ID number, the photolithography tool bias data corresponding to the third ID number and the sixth ID number and the pre-tool bias data corresponding to the fourth ID number and the seventh ID number in the process layer data page. The integration system further comprises means for refreshing the process layer overlay offset parameter database every particular period of time.

The present invention further provides a method for obtaining a set of overlay offset parameters for a first process layer having a first ID number which is going to be formed on a preceding process layer from an integration system, wherein the first process layer is formed by a first photolithography tool having a third ID number with a first mask having a second ID number and the preceding process layer is formed in a first pre-tool having a fourth ID number. The method comprises steps of providing a set of variables including the first ID number, the second ID number, the third ID number and the fourth ID number to an integration system having a process layer overlay offset parameter database. Notably, the process layer overlay offset parameter database comprises a plurality of process layer data pages and each process layer data page comprises a historic-recorded data group having at least one historic-recorded overlay offset parameter set of a process layer corresponding to the process layer data page. For each historic-recorded overlay offset parameter set, there is relative information including a second mask with a fifth ID number, a second photolithography tool with a sixth ID number and a second pre-tool with a seventh ID number. Each process layer data page further comprises a mask bias data bank having a plurality of mask bias data, a photolithography tool bias data bank having a plurality of photolithography tool bias data and a pre-tool bias data bank having a plurality of pre-tool bias data. The method further comprises steps of tracing a process layer data page by referring to the received first ID number and using a historic-recorded overlay offset parameter set selected from the historic-recorded data group of the process layer data page and a set of bias data including the mask bias data corresponding to the second ID number and the fifth ID number, the photolithography tool bias data corresponding to the third ID number and the sixth ID number and the pre-tool bias data corresponding to the fourth ID number and the seventh ID number to calculate a set of overlay offset parameters of the first process layer, wherein the mask bias data, the photolithography tool bias data and the pre-tool bias data are respectively selected from the mask bias data bank, the photolithography tool bias data bank and the pre-tool bias data bank by referring to the set of variables and the relative information corresponding to the historic-recorded overlay offset parameter set selected from the historic-recorded data group of the process layer data page.

The present invention also provides a method for updating an integration system comprising steps of providing a set of variables including a first process layer ID number, a first mask ID number, a first photolithography tool ID number, a first pre-tool ID number and a first set of overlay offset parameters to an integration system having a process layer overlay offset parameter database, wherein the first set of overlay offset parameters is obtained by performing a test run. Notably, the process layer overlay offset parameter database comprises a plurality of process layer data pages and each process layer data page comprises a historic-recorded data group having at least one historic-recorded overlay offset parameter set of a process layer corresponding to the process layer data page. For each historic-recorded, overlay offset parameter set, there is relative information including a second mask ID number, a second photolithography tool ID number and a second pre-tool ID number. Each process layer data page further comprises a mask bias data bank having a plurality of mask bias data, a photolithography tool bias data bank having a plurality of photolithography tool bias data and a pre-tool bias data bank having a plurality of pre-tool bias data. The method further comprises steps of tracing a process layer data page by referring to the provided first process layer ID number, using at least one historic-recorded overlay offset parameter set selected from the historic-recorded data group of the process layer data page and the first set of the overlay offset parameters to create a new set of bias data including a first mask bias data, a first photolithography tool bias data and a first pre-tool bias data via a serial algebraic operations, and storing the new set of bias data into the mask bias data bank, the photolithography tool bias data bank and the pre-tool bias data bank with referring to the set of the variables respectively.

In the present invention, the mask bias data can be stored in the mask bias data bank in a form of array data structure, and the value of a mask bias data of a pair of masks can be located in the mask bias data bank by referring to the ID numbers of the pair of masks. Further, the photolithography tool bias data can be stored in the photolithography tool bias data bank in a form of array data structure, and the value of a photolithography tool bias data of a pair of photolithography tools can be located in the photolithography tool bias data bank by referring to the ID numbers of the pair of photolithography tools. Moreover, the pre-tool bias data can be stored in the pre-tool bias data bank in a form of array data structure, and the value of a pre-tool bias data of a pair of pre-tools can be located in the pre-tool bias data bank by referring to the ID numbers of the pair of pre-tools.

The integration system of the present invention is independent from the photolithography tools and is a layer-centered integration system. In the integration system, since the sets of the overlay offset parameters corresponding to the same process layer and obtained under different photolithography tools, masks and pre-tools can be integrated to form the bias data banks, a set of the overlay offset parameters of a layer going to be formed with the information about the assigned photolithography tool, the assigned mask and the assigned pre-tool can be easily and precisely predicted. Notwithstanding the mask is newly released or the photolithography tool is newly released, all of the bias data banks of the process layer in the integration system is updated by performing the test run only one time to embrace new information of the newly released mask or the newly released photolithography tool. Therefore, the cost due to the test wafer used in the test run can be saved and the throughput can be increased due to time saving in the test run.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
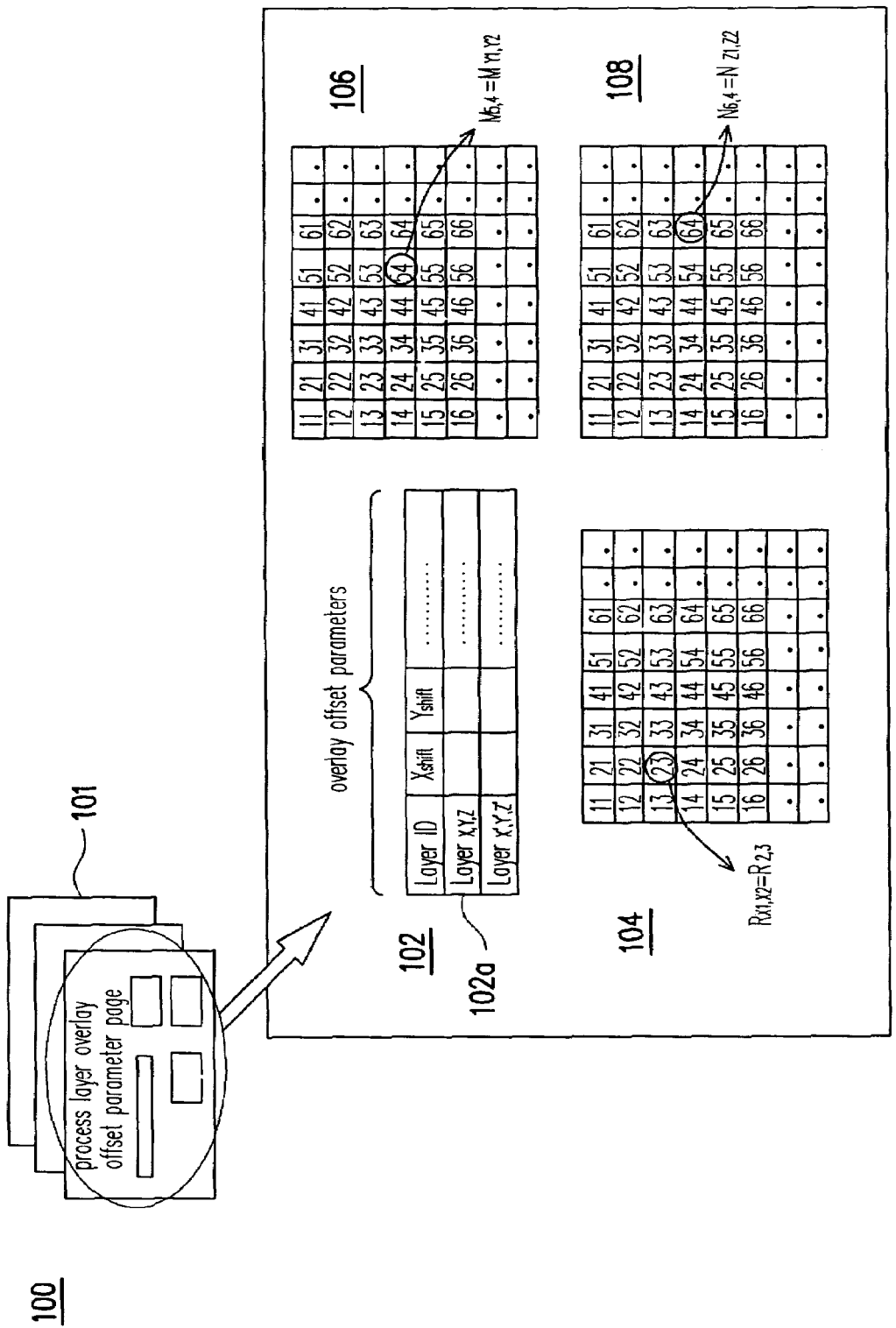
FIG. 1 is a schema illustrating the process layer overlay offset parameter database according to the preferred embodiment of the present invention.

In the invention, an integration system and an operation method thereof are provided. The integration system is a layer-centered system in which all the information about the overlay offset parameters is classified according to the process layer. By using the historical records of the overlay offset parameters and the correlative bias of the parameters based on different factors, the set of the overlay offset parameters for a particular non-process layer predetermined to be formed in assigned photolithography tool with a given pre-tool information can be successively and precisely predicted. One of the preferred embodiments of the present invention is described below. Reference will now be made in detail to the embodiment of the invention, examples of which are illustrated in the accompanying drawings. Wherever possible, the same reference numbers are used in the drawings and the description to refer to the same or like parts.

Figure 2:
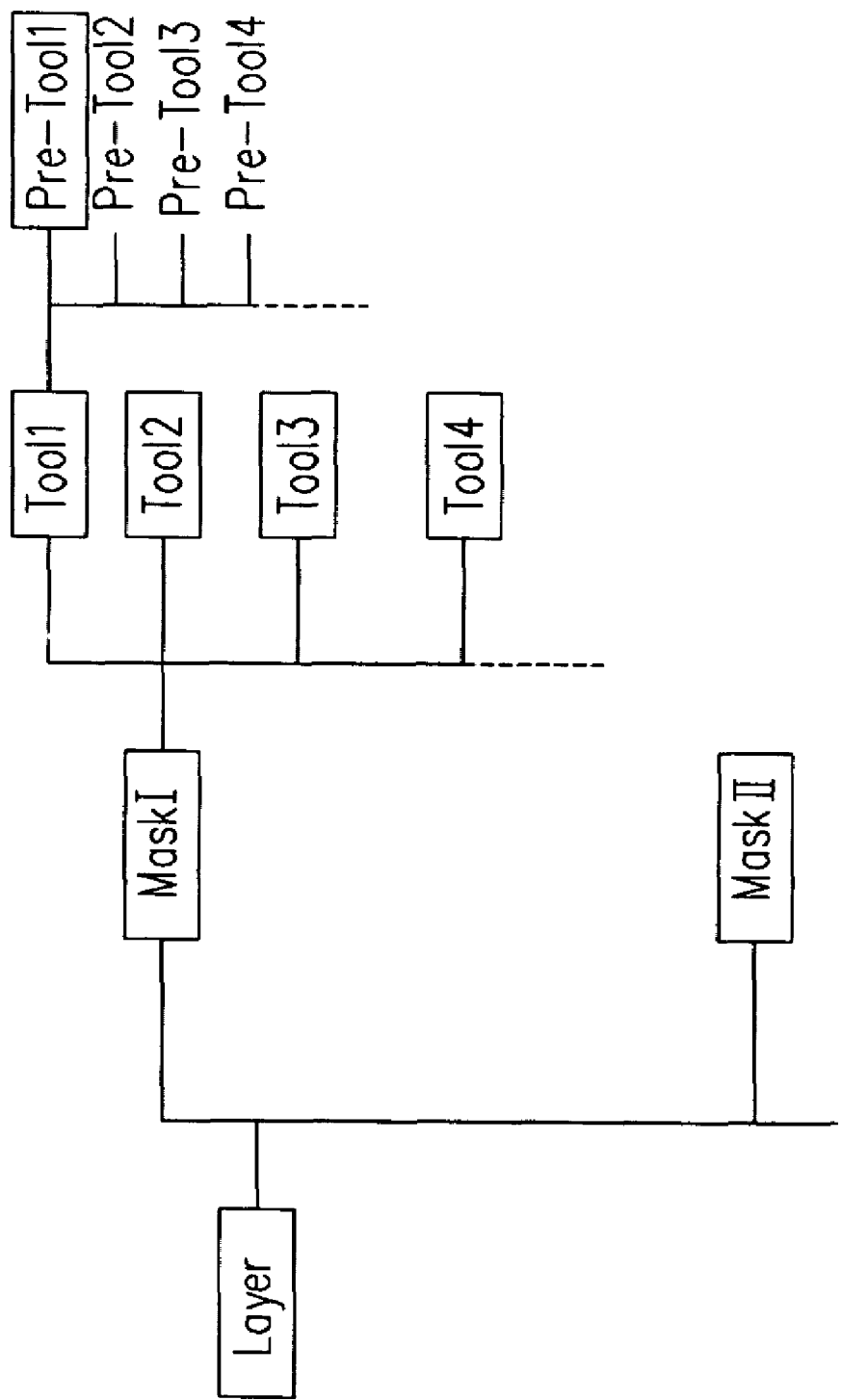
FIG. 2 illustrates the data classification directory of the overlay offset parameters according to the preferred embodiment of the present invention.

FIG. 1 is a schema illustrating the process layer overlay offset parameter database according to the preferred embodiment of the present invention. FIG. 2 illustrates the data classification directory of the overlay offset parameters according to the preferred embodiment of the present invention. Referring FIG. 1 together with FIG. 2, a process layer overlay offset parameter database 100 used in the integration system of the present invention is provided and stored in a memory storage media (not shown). The process layer overlay offset parameter database 100 possesses several process layer data pages 101. Notably, the relative information of the overlay offset parameters of the different or the same process layer are stored, classified and integrated in the process layer data pages according to the process layers respectively. For each process layer data page 101, there are a historic-recorded data group 102 for recording at least one historic-recorded overlay offset parameter set 102a of the process layer. In addition, each process layer data page further includes a mask bias data bank 104, a photolithography tool bias data bank 106 and a pre-tool bias data bank 108.

In the historic-recorded data group 102, not only the overlay offset parameters of a process layer are recorded but also the relative information, such as the suffix X, Y and Z of the Layer$_{X,Y,Z}$, one of the historic-recorded overlay offset parameter sets 102a (shown in the historic-recorded data group 102 in FIG. 1), about the process layer is recorded, wherein the suffix X and suffix Y indicate the identify (ID) number of a mask and the ID number of a photolithography tool used to form the process layer respectively and the suffix Z indicates the ID number of a pre-tool used to form the preceding process layer. Preferably, the user can select sets of historic-recorded overlay offset parameters 102a to be stored in the historic-recorded data group 102. Alternatively, the historic-recorded overlay offset parameter sets 102a can be a set of the overlay offset parameters obtained from the latest metrology result of a latest formed process layer.

Moreover, the bias data stored in the mask bias data bank 104, the photolithography tool bias data bank 106 and the pre-tool bias data bank 108 respectively is in a form of the array data structure in this embodiment. However, it is not limited to store the bias data in the form of the array data structure. The bias data can be stored in any form of data structure such as linked list data structure or double linked list data structure. For each mask bias data stored in the mask bias data bank 104, the mask bias value is denoted as $R_{X1,X2}$, wherein $R_{X1,X2}$ is the difference between the overlay offset parameters of a mask labeled X1 and the overlay offset parameters of a mask labeled X2. Moreover, the mask bias value $R_{X1,X2}$ can be calculated by using the following equation (1):

$$R_{X1,X2} = \text{Mask}_{X1} - \text{Mask}_{X2} \qquad (1)$$

where $\text{Mask}_{X1}$ and $\text{Mask}_{X2}$ denote the overlay offset parameters of the process layers formed by using mask labeled X1 and mask labeled X2 respectively. Obviously, under the circumstances that the photolithography tools are the same and the pre-tools are the same, the initial mask bias value is obtained by averaging the overlay-offset-parameter differences between the usages of two masks to form the same process layer in a specific period of time. Due to the various combinations of the photolithography tool with the pre-tool, the mask bias value $R_{X1,X2}$ can be obtained by averaging all the initial mask bias values of several identical photolithography tool-and-pre-tool combinations between mask labeled X1 and mask labeled X2 of the same process layer. Under the situation that the bias data stored in the form of array data structure, the mask bias value can be easily retrieved from the mask bias data bank 104 according to the given mask ID numbers. For example, for the overlay-offset-parameter difference between a first mask with a second ID number labeled 2 and a second mask with a fifth ID number labeled 3, the mask bias value $R_{2,3}$ can be retrieved from the array-data-structure mask bias data bank 104 at the item on column 2, row 3. Furthermore, the size of the array-data-structure mask bias data bank 104 is depends on the number of the masks in use. For example, if there are 4 masks in use, the array-data-structure mask bias data bank 104 is a four-by-four array.

Similarly, for each photolithography tool bias data stored in the photolithography tool bias data bank 106, the photolithography tool bias value is denoted as $M_{Y1,Y2}$, wherein $M_{Y1,Y2}$ is the difference between the overlay offset parameters of a photolithography tool labeled Y1 and the overlay offset parameters of a photolithography tool labeled Y2. Moreover, the mask bias value $M_{Y1,Y2}$ can be calculated by using the following equation (2):

$$M_{Y1,Y2} = \text{PhotolithographyTool}_{Y1} - \text{Photolithography-Tool}_{Y2} \qquad (2)$$

where PhotolithographyTool$_{Y1}$ and PhotolithographyTool$_{Y2}$ denote the overlay offset parameters of the process layers formed by using photolithography tool labeled Y1 and photolithography tool labeled Y2 respectively. Clearly, under the circumstances that the masks are the same and the pre-tools are the same, the initial photolithography tool bias value is obtained by averaging the overlay-offset-parameter differences between the usages of two photolithography tools to form the same process layer in a specific period of time. Due to the various combinations of the mask with the pre-tool, the photolithography tool bias value $M_{Y1,Y2}$ can be obtained by averaging all the initial photolithography tool bias values of several identical mask-and-pre-tool combinations between photolithography tool labeled Y1 and photolithography tool labeled Y2 of the same process layer. Under the situation that the bias data stored in the form of array data structure, the photolithography tool bias value can be easily retrieved from the photolithography tool bias data bank 106 according to the given photolithography tool ID numbers. For example, for the overlay-offset-parameter difference between a first photolithography tool with a third ID number labeled 5 and a second photolithography tool with a sixth ID number labeled 4, the photolithography tool bias value $M_{5,4}$ can be retrieved from the array-data-structure photolithography tool bias data bank 106 at the item on column 5, row 4. Furthermore, the size of the array-data-structure photolithography tool bias data bank 106 is depends on the number of the photolithography tools in use. For example, if there are 6 photolithography tools in use, the array-data-structure photolithography tool bias data bank 106 is a six-by-six array.

Furthermore, for each pre-tool bias data stored in the pre-tool bias data bank 108, the pre-tool bias value is denoted as $N_{Z1,Z2}$, wherein $N_{Z1,Z2}$ is the difference between the overlay offset parameters of a pre-tool labeled Z1 and the overlay offset parameters of a pre-tool labeled Z2. Moreover, the mask bias value $N_{Z1,Z2}$ can be calculated by using the following equation (3):

$$N_{Z1,Z2} = \text{preTool}_{Z1} - \text{preTool}_{Z2} \qquad (3)$$

where preTool$_{Z1}$ and preTool$_{Z2}$ denote the overlay offset parameters of the process layers formed by using photolithography tool labeled Z1 as a pre-tool and photolithography tool labeled Z2 as a pre-tool respectively. Therefore, it should be noticed that under the circumstances that the masks are the same and the photolithography tools are the same, the initial pre-tool bias value is obtained by averaging the overlay-offset-parameter differences between the usages of two pre-tools in a specific period of time. Due to the various combinations of the mask with the photolithography tool, the pre-tool bias value $N_{Z1,Z2}$ can be obtained by averaging all the initial pre-tool bias values of several identical mask-and-photolithography-tool combinations between pre-tool labeled Z1 and pre-tool labeled Z2 of the same process layer. Under the situation that the bias data stored in the form of array data structure, the pre-tool bias value can be easily retrieved from the pre-tool bias data bank 108 according to the given pre-tool ID numbers. For example, for the overlay-offset-parameter difference between a first pre-tool with a fourth ID number labeled 6 and a second pre-tool with a seventh ID number labeled 4, the pre-tool bias $N_{6,4}$ value can be retrieved from the array-data-structure pre-tool bias data bank 108 at the item on column 6, row 4. Furthermore, the size of the array-data-structure pre-tool bias data bank 108 is depends on the number of the pre-tools in use. For example, if there are 8 pre-tools in use, the array-data-structure photolithography tool bias data bank 108 is an eight-by-eight array.

In the present invention, the set of the overlay offset parameters for a non-process layer which is going to be formed are calculated by using the following equation (4):

$$\text{Layer}_{a,b,c} = \text{Layer}_{d,e,f} + R_{a,d} + M_{b,e} + N_{c,f} \qquad (4)$$

where Layer$_{d,e,f}$ denotes one of the historic-recorded overlay offset parameter sets 102a in the historic-recorded data group 102 of the process layer (as shown in FIG. 1). In the integration system of the present invention, once the decision that a layer is going to be formed in the photolithography tool labeled "b" with using the mask labeled "a" and the preceding layer of the layer is formed in the pre-tool labeled "c" is made, one of the historic-recorded overlay offset parameter sets 102a, Layer$_{d,e,f}$ can be selected from the historic-recorded data group 102 and the mask bias value $R_{a,d}$, the photolithography tool bias value $M_{b,e}$, and the pre-tool bias value $N_{c,f}$ can be retrieved from the mask bias data bank 104, the photolithography tool bias data bank 106 and the pre-tool bias data bank 108 by correspondingly referring to the mask ID numbers a and d, the photolithography tool ID numbers b and e and the pre-tool ID numbers c and f. Therefore, the overlay offset parameter set Layer$_{a,b,c}$ can be calculated by summing the selected historic-recorded set of overlay offset parameters, Layer$_{d,e,f}$ of the layer and the mask bias value $R_{a,d}$, the photolithography tool bias value $M_{b,e}$, and the pre-tool bias value $N_{c,f}$.

Hence, by using the integration system of the present invention, even though the preceding layer is not formed in the ordinary used pre-tool, the set of the overlay offset parameters can be precisely predicted based on the historic-recorded set of overlay offset parameters selected from the historic-recorded data group 102 and the mask bias value, the photolithography tool bias value and the pre-tool bias value. Furthermore, even if the mask is newly released, the test run just needs to be performed only one time to obtain a set of the overlay offset parameters and then all the mask bias values, photolithography tool bias values and the pre-tool bias values can be automatically obtained by using the equations (1), (2) and (3). For example, the mask bias data bank 104, the photolithography tool bias data bank 106 and the pre-tool bias data bank 108 are all updated by inserting the information about the newly released mask so that no matter what pre-tool it is or what photolithography tool is going to be used, the set of the overlay offset parameters, Layer$_{a,b,c}$, can be easily obtained by using equation (4) without performing the test runs in different photolithography tools with different pre-tools. Therefore, the cost due to using the test wafer in the test run can be saved and the throughput can be increased since the time for performing test run is saved.

Figure 3:
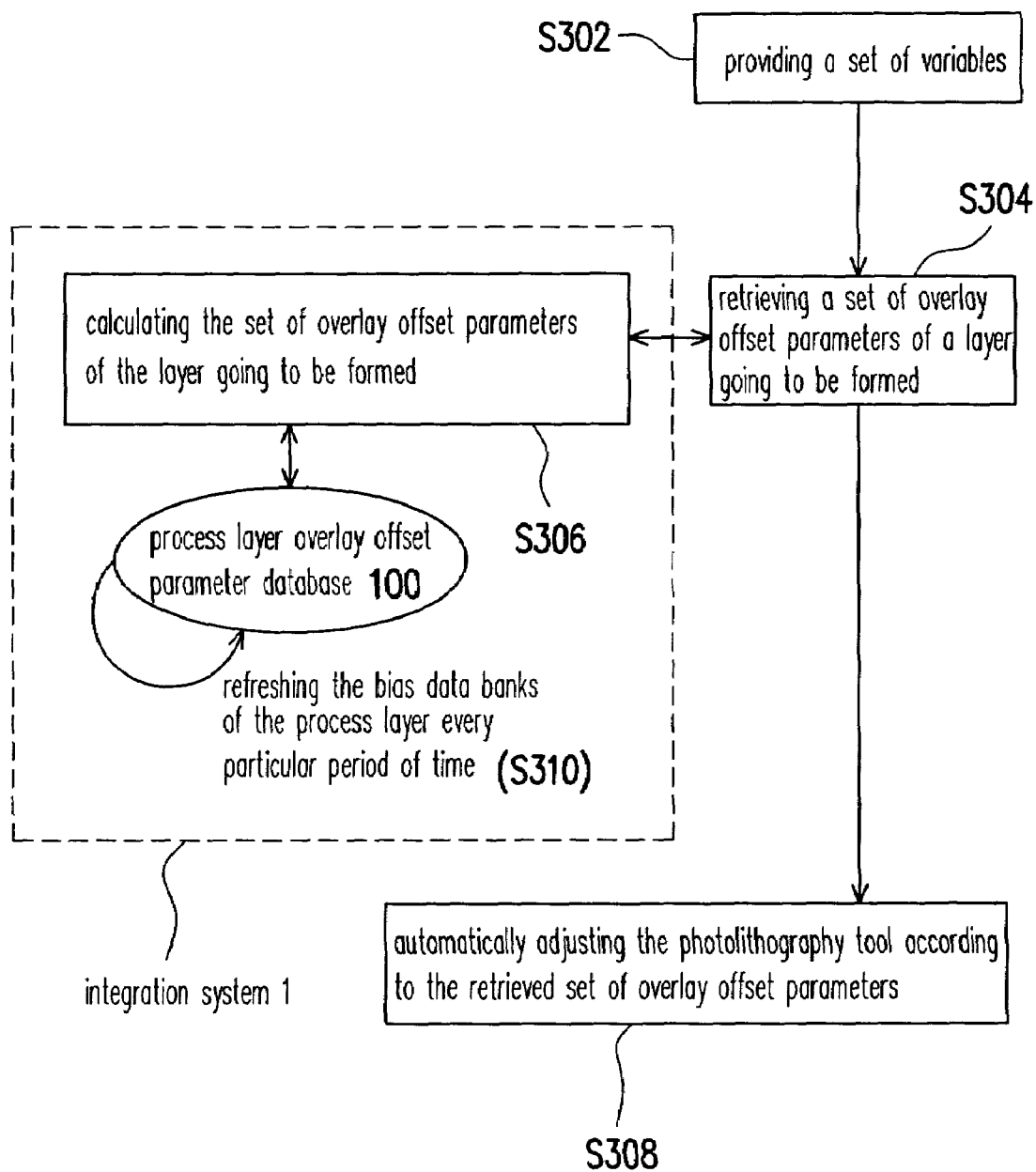
FIG. 3 is a flowchart illustrating the method of operating the integration system of the preferred embodiment according to the present invention when there are records of the mask, the photolithography tool and the pre-tool in the integration system.
Figure 4:
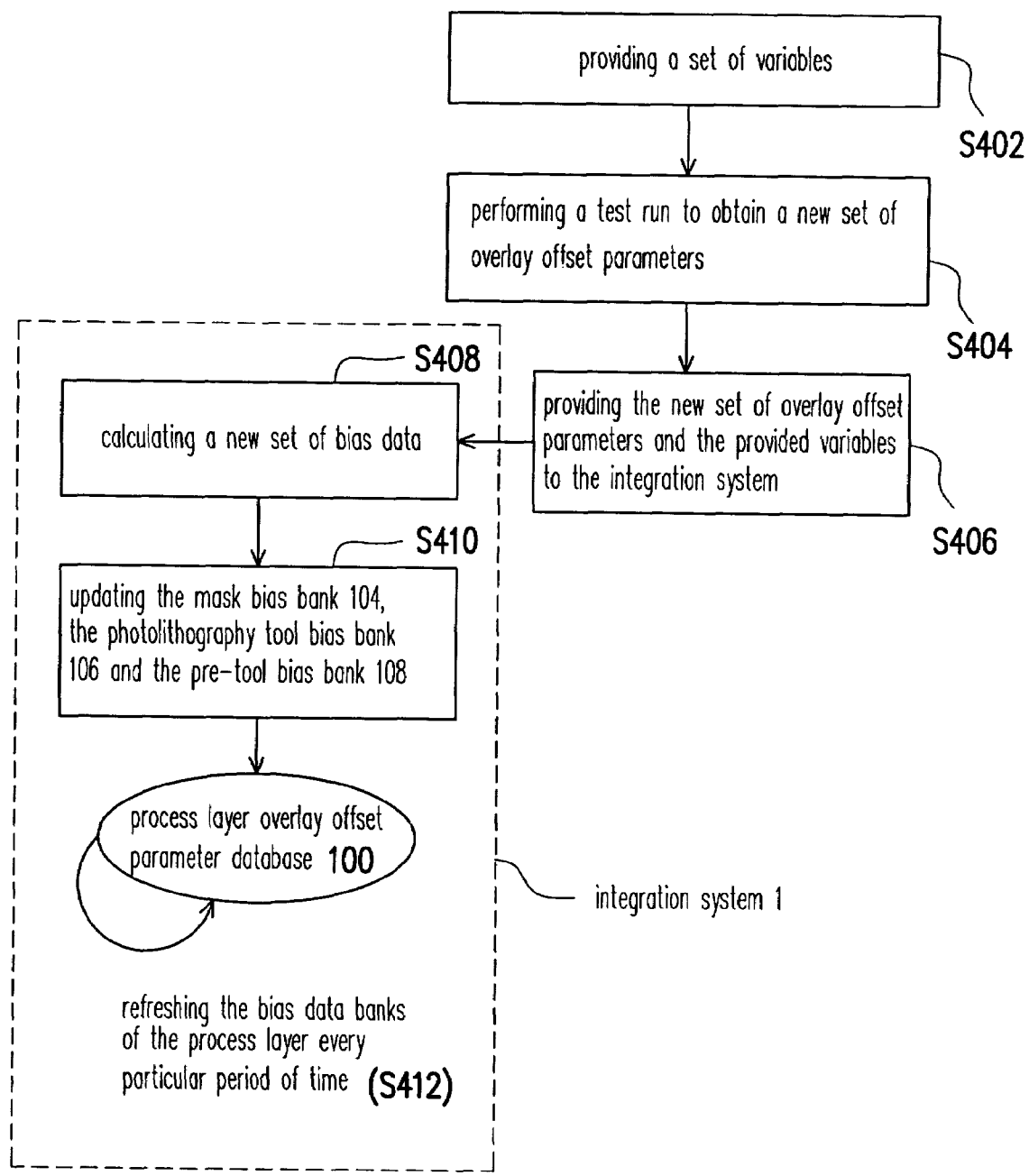
FIG. 4 is a flowchart illustrating the method of operating the integration system of the preferred embodiment according to the present invention when there is no record about the mask, the photolithography tool or the pre-tool in the integration system.

In addition, a method for operating the integration system of the present invention is detail described as following accompanying with flowcharts. FIG. 3 is a flowchart illustrating the method of operating the integration system of the preferred embodiment according to the present invention when there are records of the mask, the photolithography tool and the pre-tool in the integration system. FIG. 4 is a flowchart illustrating the method of operating the integration system of the preferred embodiment according to the present invention when there is no record about the mask, the photolithography tool or the pre-tool in the integration system.

As shown in FIG. 3, in the step S302, the variables of a layer which is going to be formed are input into or provided to an interface module stored in a memory storage media (not shown), wherein the variables includes a process layer ID number, a mask ID number, a photolithography tool ID number and a pre-tool ID number and none of the variables is first introduced to the system. Further, the interface module links to a module (not shown) of an integration system 1 of the present invention for receiving the input variables and the integration system 1 can be also stored in a memory storage media the same as the one where the interface module is stored. Moreover, the interface module and the integration system can be, for example, integrated into a computer program code. After the step S302, the step S304 of retrieving a set of the overlay offset parameters of the process layer from the integration system 1 is performed.

In the integration system 1, while the input variables are received, the data page corresponding to the process layer in the process layer overlay offset parameter database 100 (shown in FIG. 1) is traced by referring to the process layer ID number. In the step S306, by using the provided variables, one historic-recorded overlay offset parameter set 102a selected from the historic-recorded data group 102 and the relative information, X, Y and Z (shown in FIG. 1) corresponding to the selected historic-recorded overlay offset parameter set, the relative bias values, R, M and N, can be retrieved from the mask bias data bank 104, the photolithography tool bias data bank 106 and the pre-tool bias data bank 108 (shown in FIG. 1). Moreover, still in the step S306, by using the equation (4) and the retrieved bias values, the overlay offset parameters of the layer going to be formed in the assigned photolithography tool with the assigned mask and the known pre-tool information can be calculated. Thereafter, the calculated set of the overlay offset parameters is output and the assigned photolithography tool is automatically adjusted according to the calculated set of the overlay offset parameters (step 308). Practically, all the steps performed in the integration system 1 can be performed by executing a computer program code via at least one electric calculator, such as computer. That is, the means in the integration system 1 for performing the operations corresponding to the steps mentioned above can be represented by the computer program codes respectively. Furthermore, the computer program code mentioned above can be a program code consisted of several sub-program code and program segments.

Alternatively, as shown in FIG. 4, in the step S402, the variables of a process layer which is going to be formed are input into the interface module, wherein the variables includes a process layer ID number, a mask ID number, a photolithography tool ID number and a pre-tool ID number, and one of the variables including the mask ID number and the photolithography tool ID number is first introduced to the system. That is, either the mask which is going to be used is a newly released mask or the photolithography tool which is going to be used is a newly released tool. Thereafter, in the step S404, a test run is performed to obtain a new set of the overlay offset parameters of a process layer for the newly released photolithography tool or the newly released mask. Then, in the step S406, the new set of the overlay offset parameters and the input variables are input into the integration system 1.

In the integration system 1, while the new set of the overlay offset parameters and the input variables including at least the process layer ID number are received, the data page corresponding to the process layer in the process layer overlay offset parameter database 100 (shown in FIG. 1) is traced. In the step S408, by using the equations (1), (2), (3) and (4) with referring to the provided variables and the new set of the overlay offset parameters of the process layer and using the algebraic operations, the new bias values, R in the mask bias data bank 104, M the photolithography tool bias data bank 106 or N the pre-tool bias data bank 108, (shown in FIG. 1), relative to the newly released photolithography tool or the newly released mask are calculated. Then, in the step S410, the mask bias data bank 104, the photolithography tool bias data bank 106 or the pre-tool bias data bank 108 are updated to embrace the bias information, R, M or N, about the newly released mask or the newly released photolithography tool. After updating the process layer overlay offset parameter database 100, the set of the overlay offset parameters of the process layer corresponding to the given mask ID number, the given photolithography tool ID number and the given pre-tool ID number can be easily retrieved. Practically, all the steps performed in the integration system 1 can be performed by executing a computer program code via at least one electric calculator, such as computer. That is, the means in the integration system 1 for performing the operations corresponding to the steps mentioned above can be represented by the computer program codes respectively. Furthermore, the computer program code mentioned above can be a program code consisted of several sub-program code and program segments.

In addition, because the condition of every photolithography tool is changing with time, a step S310/S412 (shown in FIG. 3/FIG. 4) of refreshing the process layer overlay offset parameter database 100 is performed every particular period of time. Alternatively, the timing for refreshing the process layer overlay offset parameter database 100 can be manually controlled by user. Furthermore, the step of refreshing the process layer overlay offset parameter database 100 can be performed every time a new set of overlay offset parameters is produced. That is, a temporary list is stored in the memory storage media for storing the integration system or in the other memory storage media connecting with the integration system and the temporary list is used for storing a plurality of sets of the overlay offset parameters real-time collected for a period of time, wherein the sets of the overlay offset parameters are stored corresponding to the formation recipe and the process layer. For example, the step S310/S412 can be performed every 2 weeks. Therefore, for every particular of time, the step S310 is performed to refresh each data bank, such as the mask bias data bank 104, the photolithography tool bias data bank 106 and the pre-tool bias data bank 108, of each process layer data page in the process layer overlay offset parameter database 100 based on the collected overlay offset parameters and the equations (1), (2) and (3).

Altogether, the integration system of the present invention is independent from the photolithography tools and is a layer-centered integration system. In the integration system, since the sets of the overlay offset parameters corresponding to the same process layer and obtained under different photolithography tools, masks and pre-tools can be integrated to form the bias data banks, a set of the overlay offset parameters of a layer going to be formed with the information about the assigned photolithography tool, the assigned mask and the assigned pre-tool can be easily and precisely predicted. Notwithstanding the mask is newly released or the photolithography tool is newly released, the test run is only to performed one time to update the integration system by embracing new information of the newly released mask or the newly released photolithography tool. Therefore, the cost due to the test wafer used in the test run can be saved and the throughput can be increased due to time saving in test run.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An integration system for obtaining a set of overlay offset parameters for a first process layer having a first ID number which is going to be formed on a preceding process layer in a first photolithography tool having a third ID number with a first mask having a second ID number, wherein the preceding process layer is formed in a first pre-tool having a fourth ID number, the integration system comprising:
   means for receiving a set of variables including the first ID number, the second ID number, the third ID number and the fourth ID number from an input terminal;
   means for storing a process layer overlay offset parameter database in a memory storage media, wherein the process layer overlay offset parameter database comprises a plurality of process layer data pages and each process layer data page comprises:
      a historic-recorded data group having at least a historic-recorded overlay offset parameter set of a process layer corresponding to the process layer data page, wherein each historic-recorded overlay offset parameter set possesses relative information including a second mask with a fifth ID number, a second photolithography tool with a sixth ID number and a second pre-tool with a seventh ID number;
      a mask bias data bank having a plurality of mask bias data;
      a photolithography tool bias data bank having a plurality of photolithography tool bias data; and
      a pre-tool bias data bank having a plurality of pre-tool bias data;
   means for tracing a process layer data page by referring to the received first ID number;
   means for calculating a set of the overlay offset parameters of the first process layer by using a first historic-recorded overlay offset parameter set selected from the historic-recorded data group of the process layer data page and a set of bias data including the mask bias data corresponding to the second ID number and the fifth ID number, the photolithography tool bias data corresponding to the third ID number and the sixth ID number and the pre-tool bias data corresponding to the fourth ID number and the seventh ID number in the process layer data page; and
   means for refreshing the process layer overlay offset parameter database.

2. The integration system of claim 1, wherein the value of each mask bias data is determined according to:
   $R_{X1,X2}=Mask_{X1}-Mask_{X2}$, wherein $R_{X1,X2}$ denotes the value of the mask bias data, $Mask_{X1}$ denotes a first overlay offset parameter set corresponding to the process layer formed by using a third mask with an ID number X1 and $Mask_{X2}$ denotes a second overlay offset parameters set corresponding to the process layer formed by using a fourth mask with an ID number X2.

3. The integration system of claim 1, wherein the value of each photolithography tool bias data is determined according to:
   $M_{Y1,Y2}=PhotolithographyTool_{Y1}-PhotolithographyTool_{Y2}$, wherein $M_{Y1,Y2}$ denotes the value of the photolithography tool bias data, $PhotolithographyTool_{Y1}$ denotes a third overlay offset parameter set corresponding to the process layer formed by using a third photolithography tool with an ID number Y1 and $PhotolithographyTool_{Y2}$ denotes a fourth overlay offset parameters set corresponding to the process layer formed by using a fourth photolithography tool with an ID number Y2.

4. The integration system of claim 1, wherein the value of each pre-tool bias data is determined according to:
   $N_{Z1,Z2}=preTool_{Z1}-preTool_{Z2}$, wherein $N_{Z1,Z2}$ denotes the pre-tool bias value of the pre-tool bias data, $preTool_{Z1}$ denotes a fifth overlay offset parameter set corresponding to the preceding process layer formed by using a fifth photolithography tool with an ID number Z1 and $preTool_{Z2}$ denotes a sixth overlay offset parameters set corresponding to the preceding process layer formed by using a sixth photolithography tool with an ID number Z2.

5. The integration system of claim 1, wherein the set of the overlay offset parameters of the first process layer is calculated according to:
   $Layer_{a,b,c}=Layer_{d,e,f}+R_{a,d}+M_{b,e}+N_{c,f}$, wherein a denotes the second ID number, b denotes the third ID number, c denotes the fourth ID number, d denotes the fifth ID number, e denotes the sixth ID number, f denotes the seventh ID number, $Layer_{a,b,c}$ denotes the set of the overlay offset parameters of the first process layer, $Layer_{d,e,f}$ denotes the first historic-recorded overlay offset parameter set in the historic-recorded data group, $R_{a,d}$ denotes a mask bias value corresponding to the first mask with the second ID number and the second mask with the fifth ID number, $M_{b,e}$ denotes a photolithography tool bias value corresponding to the first photolithography tool with the third ID number and the second photolithography tool with the sixth ID number, and $N_{c,f}$ denotes a pre-tool bias value corresponding to the first pre-tool with the fourth ID number and the second pre-tool with the seventh ID number.

6. The integration system of claim 1, further comprising a means for real-time collecting a plurality of sets of the overlay offset parameters and storing the sets of the overlay offset parameters in a temporary list stored in the memory storage media.

7. The integration system of claim 1, wherein the mask bias data can be stored in the mask bias data bank in a form of array data structure, and the value of a mask bias data of a pair of masks can be located in the mask bias data bank by referring to the ID numbers of the pair of masks.

8. The integration system of claim 1, wherein the photolithography tool bias data can be stored in the photolithography tool bias data bank in a form of array data structure, and the value of a photolithography tool bias data of a pair of photolithography tools can be located in the photolithography tool bias data bank by referring to the ID numbers of the pair of photolithography tools.

9. The integration system of claim 1, wherein the pre-tool bias data can be stored in the pre-tool bias data bank in a form of array data structure, and the value of a pre-tool bias data of a pair of pre-tools can be located in the pre-tool bias data bank by referring to the ID numbers of the pair of pre-tools.

10. A method for obtaining a set of overlay offset parameters for a first process layer having a first ID number which is going to be formed on a preceding process layer from an integration system, wherein the first process layer is formed by a first photolithography tool having a third ID number with a first mask having a second ID number and the preceding process layer is formed in a first pre-tool having a fourth ID number, the method comprising:

providing a set of variables including the first ID number, the second ID number, the third ID number and the fourth ID number to an integration system having a process layer overlay offset parameter database, wherein the process layer overlay offset parameter database comprises a plurality of process layer data pages and each process layer data page comprises:

a historic-recorded data group having at least a historic-recorded overlay offset parameter set of a process layer corresponding to the process layer data page, wherein each historic-recorded overlay offset parameter set possesses relative information including a second mask with a fifth ID number, a second photolithography tool with a sixth ID number and a second pre-tool with a seventh ID number;

a mask bias data bank having a plurality of mask bias data;

a photolithography tool bias data bank having a plurality of photolithography tool bias data; and a pre-tool bias data bank having a plurality of pre-tool bias data;

tracing a process layer data page by referring to the first ID number; and using a first historic-recorded overlay offset parameter set selected from the historic-recorded data group of the process layer data page and a set of bias data including the mask bias data corresponding to the second ID number and the fifth ID number, the photolithography tool bias data corresponding to the third ID number and the sixth ID number and the pre-tool bias data corresponding to the fourth ID number and the seventh ID number to calculate a set of overlay offset parameters of the first process layer, wherein the mask bias data, the photolithography tool bias data and the pre-tool bias data are respectively selected from the mask bias data bank, the photolithography tool bias data bank and the pre-tool bias data bank by referring to the set of variables and the relative information corresponding to the first historic-recorded overlay offset parameter set selected from the historic-recorded data group of the process layer data page.

11. The method of claim 10, wherein the value of each mask bias data is determined according to:

$R_{X1,X2} = Mask_{X1} - Mask_{X2}$, wherein $R_{X1,X2}$ denotes the value of the mask bias data, $Mask_{X1}$ denotes a first overlay offset parameter set corresponding to the process layer formed by using a third mask with an ID number X1 and $Mask_{X2}$ denotes a second overlay offset parameters set corresponding to the process layer formed by using a fourth mask with an ID number X2.

12. The method of claim 10, wherein the value of each photolithography tool bias data is determined according to:

$M_{Y1,Y2} = PhotolithographyTool_{Y1} - PhotolithographyTool_{Y2}$, wherein $M_{Y1,Y2}$ denotes the value of the photolithography tool bias data, PhotolithographyTool$_{Y1}$ denotes a third overlay offset parameter set corresponding to the process layer formed by using a third photolithography tool with an ID number Y1 and PhotolithographyTool$_{Y2}$ denotes a fourth overlay offset parameters set corresponding to the process layer formed by using a fourth photolithography fool with an ID number Y2.

13. The method of claim 10, wherein the value of each pre-tool bias data is determined according to:

$N_{Z1,Z2} = preTool_{Z1} - preTool_{Z2}$, wherein $N_{Z1,Z2}$ denotes the pre-tool bias value of the pre-tool bias data, preTool$_{Z1}$ denotes a fifth overlay offset parameter set corresponding to the preceding process layer formed by using a fifth photolithography tool with an ID number Z1 and preTool$_{Z2}$ denotes a sixth overlay offset parameters set corresponding to the preceding process layer formed by using a sixth photolithography tool with an ID number Z2.

14. The method of claim 10, wherein the set of the overlay offset parameters of the first process layer is calculated according to:

Layer$_{a,b,c}$ = Layer$_{d,e,f}$ + R$_{a,d}$ + M$_{b,e}$ + N$_{c,f}$, wherein a denotes the second ID number, b denotes the third ID number, c denotes the fourth ID number, d denotes the fifth ID number, e denotes the sixth ID number, f denotes the seventh ID number, Layer$_{a,b,c}$ denotes the set of the overlay offset parameters of the first process layer, Layer$_{d,e,f}$ denotes the first historic-recorded overlay offset parameter set in the historic-recorded data group, R$_{a,d}$ denotes a mask bias value corresponding to the first mask with the second ID number and the second mask with the fifth ID number, M$_{b,e}$ denotes a photolithography tool bias value corresponding to the first photolithography tool with the third ID number and the second photolithography tool with the sixth ID number, and N$_{c,f}$ denotes a pre-tool bias value corresponding to the first pre-tool with the fourth ID) number and the second pre-tool with the seventh ID number.

15. The method of claim 10, further comprising:

real-time collecting a plurality of sets of the overlay offset parameters;

storing the sets of the overlay offset parameters in a temporary list stored in the memory storage media; and refreshing the process layer overlay offset parameter database using the temporary list.

16. A method for updating an integration system comprising:

providing a set of variables including a first process layer ID number, a first mask ID number, a first photolithography tool ID number, a first pre-tool ID number and a first set of overlay offset parameters to an integration system having a process layer overlay offset parameter database, wherein the first overlay offset parameter set is obtained by performing a test run and the process layer overlay offset parameter database comprises a plurality of process layer data pages and each process layer data page comprises:

a historic-recorded data group having at least a historic-recorded overlay offset parameter set of a process layer corresponding to the process layer data page, wherein each historic-recorded overlay offset parameter set possesses relative information including a second mask ID number, a second photolithography tool ID number and a second pre-tool ID number;

a mask bias data bank having a plurality of mask bias data;

a photolithography tool bias data bank having a plurality of photolithography tool bias data; and a pre-tool bias data bank having a plurality of pre-tool bias data;

tracing a process layer data page by referring to the inputted first process layer ID number;

using at least one first historic-recorded overlay offset parameter set selected from the historic-recorded data group of the process layer data page and the first set of the overlay offset parameters to calculate a new set of bias data including a first mask bias data, a first photolithography tool bias data and a first pre-tool bias data via a serial algebraic operations; and storing the new set of bias data into the mask bias data bank, the photolithography tool bias data bank and the pre-tool bias data bank.

17. The method of claim 16, wherein the value of each mask bias data is determined according to:

$R_{X1,X2}=Mask_{X1}-Mask_{X2}$, wherein $R_{X1,X2}$ denotes the value of the mask bias data, $Mask_{X1}$ denotes a second overlay offset parameter set corresponding to the process layer formed by using a third mask with an ID number X1 and $Mask_{X2}$ denotes a third overlay offset parameters set corresponding to the process layer formed by using a fourth mask with an ID number X2.

18. The method of claim 16, wherein the value of each photolithography tool bias data is determined according to:

$M_{Y1,Y2}=PhotolithographyTool_{Y1}\ PhotolithographyTool_{Y2}$, wherein $M_{Y1,Y2}$ denotes the value of the photolithography tool bias data, $PhotolithographyTool_{Y1}$ denotes a fourth overlay offset parameter set corresponding to the process layer formed by using a third photolithography tool with an ID number Y1 and $PhotolithographyTool_{Y2}$ denotes a fifth overlay offset parameters set corresponding to the process layer formed by using a fourth photolithography tool with an ID number Y2.

19. The method of claim 16, wherein the value of each pre-tool bias data is determined according to:

$N_{Z1,Z2}=preTool_{Z1}\ preTool_{Z2}$, wherein $N_{Z1,Z2}$ denotes the value of the pre-tool bias data, $preTool_{Z1}$ denotes a sixth overlay offset parameter set corresponding to the preceding process layer formed by using a fifth photolithography tool with an ID number Z1 and $preTool_{Z2}$ denotes a seventh overlay offset parameters set corresponding to the preceding process layer formed by using a sixth photolithography tool with an ID number Z2.

20. The method of claim 16, wherein a plurality of mathematic equations used in the serial algebraic operations and the mathematic equations comprises:

a first equation represented by $R_{X1,X2}=Mask_{X1}-Mask_{X2}$, wherein $R_{X1,X2}$ denotes the value of the mask bias data, $Mask_{X1}$ denotes a second overlay offset parameter set corresponding to the process layer formed by using a third mask with an ID number X1 and $Mask_{X2}$ denotes a third overlay offset parameters set corresponding to the process layer formed by using a fourth mask with an ID number X2;

a second equation represented by $M_{Y1,Y2}=PhotolithographyTool_{Y1}-Photolithography Tool_{Y2}$, wherein $M_{Y1,Y2}$ denotes the value of the photolithography tool bias data, $PhotolithographyTool_{Y1}$ denotes a fourth overlay offset parameter set corresponding to the process layer formed by using a third photolithography tool with an ID number Y1 and $PhotolithographyTool_{Y2}$ denotes a fifth overlay offset parameters set corresponding to the process layer formed by using a fourth photolithography tool with an ID number Y2.

a third equation represented by $N_{Z1,Z2}=preTool_{Z1}-preTool_{Z2}$, wherein $N_{Z1,Z2}$ denotes the value of the pre-tool bias data, $preTool_{Z1}$ denotes a sixth overlay offset parameter set corresponding to the preceding process layer formed by using a fifth photolithography tool with an ID number Z1 and $preTool_{Z2}$ denotes a seventh overlay offset parameters set corresponding to the preceding process layer formed by using a sixth photolithography tool with an ID number Z2.

21. The method of claim 16, further comprising:

real-time collecting a plurality of sets of the overlay offset parameters;

storing the sets of the overlay offset parameters in a temporary list stored in the memory storage media; and refreshing the process layer overlay offset parameter database using the temporary list.

* * * * *